United States Patent
Cao et al.

(10) Patent No.: US 12,310,247 B2
(45) Date of Patent: May 20, 2025

(54) METHOD FOR MANUFACTURING SEMICONDUCTOR STRUCTURE, SEMICONDUCTOR STRUCTURE, AND SEMICONDUCTOR MEMORY

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Kanyu Cao, Hefei (CN); Xiaoguang Wang, Hefei (CN); Huihui Li, Hefei (CN); Dinggui Zeng, Hefei (CN); Jiefang Deng, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 490 days.

(21) Appl. No.: 17/842,937

(22) Filed: Jun. 17, 2022

(65) Prior Publication Data
US 2023/0063767 A1 Mar. 2, 2023

Related U.S. Application Data

(63) Continuation of application No. PCT/CN2022/077718, filed on Feb. 24, 2022.

(30) Foreign Application Priority Data

Aug. 31, 2021 (CN) .......................... 202111009844.9

(51) Int. Cl.
*H01L 43/12* (2006.01)
*H10B 61/00* (2023.01)
(Continued)

(52) U.S. Cl.
CPC ............. *H10N 50/01* (2023.02); *H10B 61/00* (2023.02); *H10N 50/80* (2023.02)

(58) Field of Classification Search
None
See application file for complete search history.

(56) References Cited

U.S. PATENT DOCUMENTS

| 10,049,711 B2 | 8/2018 | Nakatsuka et al. |
| 10,593,678 B1 | 3/2020 | Guo et al. |

(Continued)

FOREIGN PATENT DOCUMENTS

| CN | 106104790 A | 11/2016 |
| CN | 108931882 A | 12/2018 |

(Continued)

OTHER PUBLICATIONS

Chung S. W., et al, "4Gbit density STT-MRAM using perpendicular MTJ realized with compact cell structure", [IEEE 2016 IEEE International Electron Devices Meeting (IEDM)—San Francisco, CA, USA (Dec. 3, 2016-Dec. 2016.)], doi: 10.1109/IEDM.2016.7838490, p. 659-662.

(Continued)

*Primary Examiner* — William C Trapanese
(74) *Attorney, Agent, or Firm* — Kilpatrick Townsend & Stockton LLP

(57) ABSTRACT

A method for manufacturing a semiconductor structure, a semiconductor structure and a semiconductor memory are provided. The method includes: providing a substrate; forming an MTJ structure and a first mask structure sequentially on the substrate; patterning the first mask structure to form a first pattern extending in a first direction; forming a second mask structure on the first pattern; patterning the second mask structure to form a second pattern extending in a second direction, in which the first direction intersects the (Continued)

second direction, and is not perpendicular to the second direction; patterning the first pattern by utilizing the second pattern to form a cellular pattern; and transferring the cellular pattern to the MTJ structure to form a cellular MTJ array.

15 Claims, 46 Drawing Sheets

(51) Int. Cl.
*H10N 50/01* (2023.01)
*H10N 50/80* (2023.01)

(56) References Cited

U.S. PATENT DOCUMENTS

| | | | |
|---|---|---|---|
| 10,620,528 B2 | 4/2020 | Kim | |
| 11,043,632 B2 | 6/2021 | Sundar | |
| 2009/0170030 A1* | 7/2009 | Scheuerlein | G03F 1/70 430/311 |
| 2011/0076784 A1 | 3/2011 | Druist | |
| 2018/0341172 A1 | 11/2018 | Kim et al. | |
| 2020/0066730 A1 | 2/2020 | Guo et al. | |
| 2020/0185389 A1 | 6/2020 | Guo et al. | |
| 2020/0209733 A1 | 7/2020 | Kim et al. | |
| 2021/0083180 A1 | 3/2021 | Sundar et al. | |
| 2023/0061322 A1* | 3/2023 | Wang | H10B 61/00 |
| 2023/0065721 A1* | 3/2023 | Shin | G03F 1/24 |

FOREIGN PATENT DOCUMENTS

| | | |
|---|---|---|
| CN | 112309986 A | 2/2021 |
| CN | 112514070 A | 3/2021 |
| CN | 112563409 A | 3/2021 |

OTHER PUBLICATIONS

Rho, Kwangmyoung, et al., "23.5 A 4Gb LPDDR2 STT-MRAM with compact 9F2 1T1MTJ cell and hierarchical bitline architecture", [IEEE 2017 IEEE International Solid-State Circuits Conference—(ISSCC)—San Francisco, CA, USA (Feb. 5, 2017-Feb. 9, 2017)], doi: 10.1109/ISSCC.2017.7870428, p. 396-397.

* cited by examiner

METHOD FOR MANUFACTURING SEMICONDUCTOR STRUCTURE, SEMICONDUCTOR STRUCTURE, AND SEMICONDUCTOR MEMORY

CROSS-REFERENCE TO RELATED APPLICATIONS

This application is a continuation application of International Application No.: PCT/CN2022/077718, filed on Feb. 24, 2022, which claims priority to Chinese Patent Application No. 202111009844.9, filed on Aug. 31, 2021. The disclosures of International Application No.: PCT/CN2022/077718 and Chinese Patent Application No. 202111009844.9 are hereby incorporated by reference in their entireties.

BACKGROUND

Electronic memories include volatile memories and nonvolatile memories. A volatile memory may lose stored data in case of a power failure, while a nonvolatile memory may retain data in case of a power failure. A magneto-resistive random access memory (MRAM) is a nonvolatile memory. Compared with an existing nonvolatile memory (such as a flash random access memory), the MRAM is faster in storage and more durable. Compared with an existing volatile memory (such as a dynamic random access memory (DRAM) and a static random access memory), the MRAM is lower in power consumption.

A MRAM stores data through magnetic tunnel junctions (MTJs). However, a memory cell of the MRAM is much larger than that of a memory of another type, so that its memory density is low, and application of the MRAM to a broader market is limited.

SUMMARY

Embodiments of the disclosure relate to the technical field of semiconductors, and particularly to a method for manufacturing a semiconductor structure, a semiconductor structure, and a semiconductor memory.

Embodiments of the disclosure provide a method for manufacturing a semiconductor structure, a semiconductor structure, and a semiconductor memory.

According to a first aspect, embodiments of the disclosure provide a method for manufacturing a semiconductor structure, which includes the following operations.

A substrate is provided.

An MTJ structure and a first mask structure are formed sequentially on the substrate.

The first mask structure is patterned to form a first pattern extending in a first direction.

A second mask structure is formed on the first pattern.

The second mask structure is patterned to form a second pattern extending in a second direction, in which the first direction intersects the second direction, and the first direction is not perpendicular to the second direction.

The first pattern is patterned by utilizing the second pattern to form a cellular pattern.

The cellular pattern is transferred to the MTJ structure to form a cellular MTJ array.

According to the second aspect, embodiments of the disclosure provide a semiconductor structure, which includes: a substrate; and a cellular MTJ array formed on the substrate.

The cellular MTJ array is arranged in a cellular pattern. The cellular pattern includes a first pattern extending in a first direction and a second pattern extending in a second direction, in which the first direction intersects the second direction, and the first direction is not perpendicular to the second direction.

According to the third aspect, embodiments of the disclosure provide a semiconductor memory, which includes the semiconductor structure as described in the second aspect.

In one of the embodiments, the semiconductor memory includes a MRAM.

DETAILED DESCRIPTION

Figure 1:
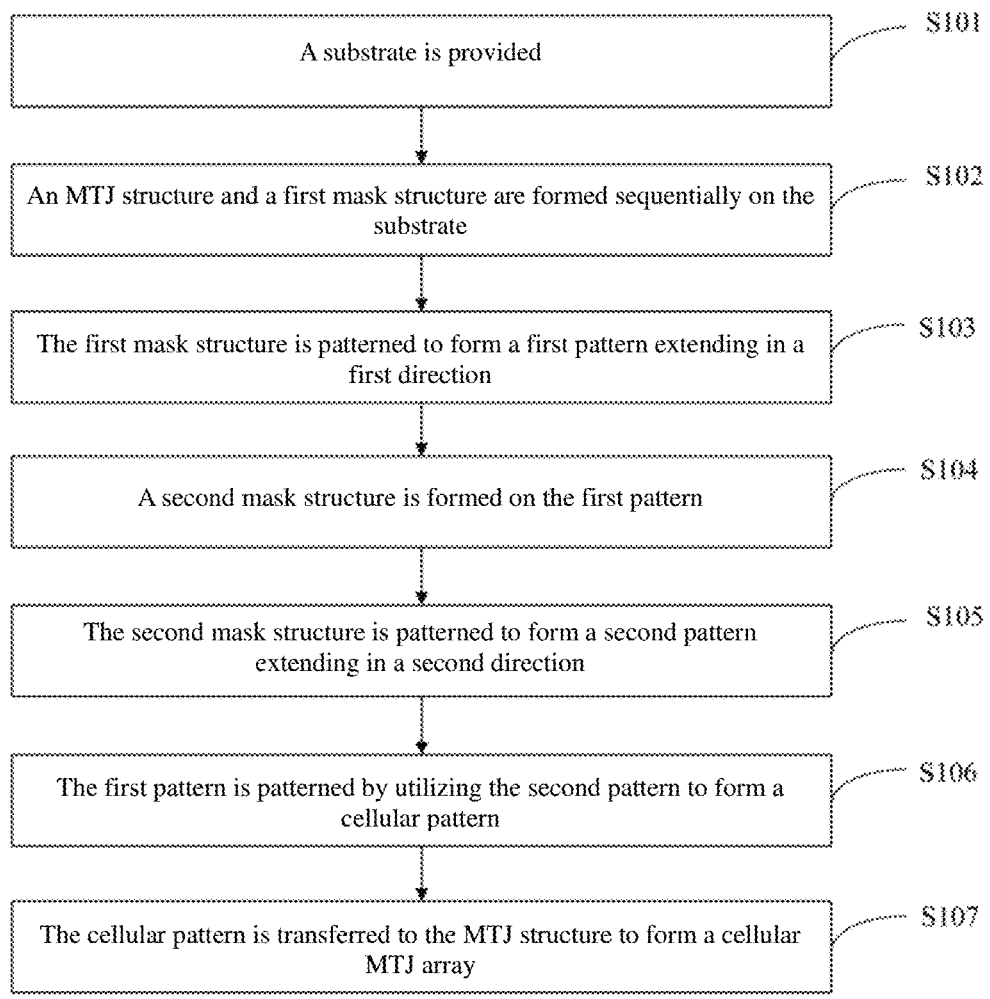
FIG. 1 is a schematic flowchart of a method for manufacturing a semiconductor structure according to an embodiment of the disclosure.

The technical solutions in the embodiments of the disclosure will be described clearly and completely below in combination with the drawings in the embodiments of the disclosure. It can be understood that specific embodiments described herein are only for explaining the related disclosure rather than limiting the disclosure. In addition, it is also to be noted that, for ease of description, only parts related to the related disclosure are shown in the drawings.

Unless otherwise defined, all technical and scientific terms used herein have the same meanings as commonly understood by those skilled in the art the disclosure belongs to. Terms used herein are only for a purpose of describing the embodiments of the disclosure and not intended to limit the disclosure.

"Some embodiments" involved in the following descriptions describes a subset of all possible embodiments. However, it can be understood that "some embodiments" may be the same or different subsets of all the possible embodiments, and may be combined with one another without conflicts.

It is to be pointed out that term "first/second/third" involved in the embodiments of the disclosure is only for distinguishing similar objects and does not represent a specific sequence of the objects. It can be understood that "first/second/third" may be interchanged according to specific sequences or orders if allowed such that the embodiments of the disclosure described herein may be implemented in sequences except those illustrated or described herein.

At present, MRAMs are mainly aimed at niche markets. Compared with DRAMs, the memory cells of MRAMs are much larger, which limits the application of MRAMs in mainstream markets, and therefore, MRAMs can only be used in a few fields.

In order to improve the memory density of MRAM, the memory cell thereof needs to be reduced. However, the improvement of the memory density of the MRAM meets great challenges at present mainly due to the patterning process of the MTJ array in the MRAM. Therefore, the embodiments of the disclosure are desired to provide a patterning solution capable of manufacturing a high-density MTJ array, to improve the memory density of the MRAM.

However, it is hard to achieve high-density etching of MTJs due to the shadow effect. For complex and challenging patterning of a high-density MTJ array, the embodiments of the disclosure provide a solution, of photo-etching with a high-density dot matrix pattern, in which a high-density cellular MTJ array is utilized, so that the memory density of a semiconductor memory is improved when the memory is formed, and it facilitates the extension of the application market of MRAMs. Moreover, the cellular pattern is highly symmetrical, which is advantageous to the patterning process when an MTJ layer is etched.

Each embodiment of the disclosure will be described below in combination with the drawings in detail.

In some embodiments of the disclosure, referring to FIG. 1, FIG. 1 is a schematic flowchart of a method for manufacturing a semiconductor structure according to an embodiment of the disclosure. As shown in FIG. 1, the method includes the following operations.

In S101, a substrate is provided.

It is to be noted that the substrate may be a silicon substrate or other suitable substrate materials such as silicon, germanium, a silicon-germanium compound and the like, such as a doped or undoped mono-crystalline silicon substrate, a polysilicon substrate or the like. No specific limit is made thereto in the embodiment of the disclosure.

In the embodiment of the disclosure, the substrate may preferably be a wafer that has been subjected to a front end of line (FEOL).

In S102, an MTJ structure and a first mask structure are formed sequentially on the substrate.

It is to be noted that, in the embodiment of the disclosure, THE MTJ structure and THE first mask structure are formed sequentially on the substrate. The MTJ structure is subsequently processed to finally obtain an MTJ array. A series of processes are performed on the first mask structure to obtain a cellular pattern. The pattern is transferred to the MTJ structure so as to obtain the MTJ array with the cellular structure.

Figure 2:
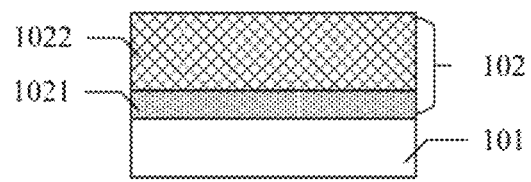
FIG. 2 is a schematic diagram of the structure obtained after an MTJ structure is formed according to an embodiment of the disclosure.

Referring to FIG. 2, FIG. 2 is a schematic diagram of the structure obtained after the MTJ structure is formed according to an embodiment of the disclosure. Further, as shown in FIG. 2, when the MTJ structure 102 is formed on a substrate 101, in some embodiments, the MTJ structure 102 includes an MTJ layer 1021 and an MTJ mask layer 1022. The MTJ layer 1021 is formed on the substrate 101. The MTJ mask layer 1022 is formed on the MTJ layer 1021.

It is to be noted that, in the embodiment of the disclosure, the MTJ structure 102 may specifically include the MTJ layer 1021 and the MTJ mask layer 1022. The MTJ layer 1021 is the part including MTJ components, and is directly formed on the substrate 101. The MTJ mask layer 1022 is formed on the MTJ layer 1021, and serves as a mask for patterning the MTJ layer 1021 in subsequent operations, as well as serves as a top electrode in the finally obtained semiconductor structure.

It is also to be noted that, for the MTJ structure 102, when forming the MTJ layer 1021 and the MTJ mask layer 1022, in some embodiments, the height ratio of the MTJ mask layer 1022 to the MTJ layer 1021 may range from 1.5:1 to 3:1. That is, the height of the MTJ mask layer 1022 is larger than that of the MTJ layer 1021. Therefore, the MTJ mask layer 1022 may be prevented from being exhausted during subsequent patterning the MTJ layer 1021.

In S103, the first mask structure is patterned to form a first pattern extending in a first direction.

In S104, a second mask structure is formed on the first pattern.

In S105, the second mask structure is patterned to form a second pattern extending in a second direction.

In S106, the first pattern is patterned by utilizing the second pattern to form a cellular pattern.

It is to be noted that, for S102 to S106, in an implementation mode of the embodiment of the disclosure, the first mask structure is a double-layer mask structure. That is, the first mask structure includes a mask structure layer and a first photoresist layer. Then, the process for forming the cellular pattern in this implementation mode will be described in detail.

Figure 3:
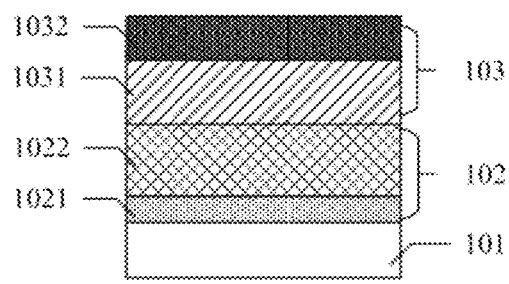
FIG. 3 is a schematic diagram of the structure obtained after a first mask structure is formed according to an embodiment of the disclosure.

For S102, after the MTJ structure 102 is formed, a first mask structure 103 continues to be formed on the MTJ structure 102. Referring to FIG. 3, FIG. 3 is a schematic diagram of the structure obtained after a first mask structure 103 is formed according to an embodiment of the disclosure.

As shown in FIG. 3, in this implementation mode, the first mask structure 103 includes a mask structure layer 1031 and a first photoresist layer 1032. The mask structure layer 1031 is formed on the MTJ structure 102. The first photoresist layer 1032 is formed on the mask structure layer 1031.

In a specific example, for the structure shown in FIG. 3, the MTJ layer may specifically include (from bottom to top) a buffer layer, a pinning layer, a reference layer, a tunneling barrier, a free layer and a cap layer. The material of the buffer layer may include tantalum (Ta), platinum (Pt) and nickel-iron (NiFe). The material of the pinning layer may include a cobalt/platinum composite ([Co/Pt]n) or a cobalt/palladium composite ([Co/Pd]n). The material of the reference layer may include cobalt-iron (CoFe), cobalt (Co) and cobalt-iron-boron (CoFeB). The material of the tunneling barrier may include magnesium oxide (MgO) and alumina (AlOx). A material of the free layer may include CoFe and CoFeB. A material of the cap layer may include ruthenium (Ru) and Ta.

The MTJ mask layer may specifically include (from bottom to top) a metal layer and a dielectric layer. The material of the metal layer may include Ta, tantalum nitride (TiN), titanium nitride (TiN) and titanium (Ti). The material of the dielectric layer may include silicon nitride (SiNx), silicon oxide (SiOx) and carbide. In an example of the embodiment of the disclosure, the MTJ mask layer may include a dielectric layer.

The mask structure layer may specifically include (from bottom to top) an etching stop layer and a dielectric layer. The material of the etching stop layer may include SiNx, silicon oxynitride (SiON) and poly silicon (Si). The material of the dielectric layer may include carbide spin on carbon (SOC) and SiOx.

The first photoresist layer may specifically include (from bottom to top) a bottom anti-reflection coating (BARC) and a photoresist.

For S103, after the first mask structure 103 is formed, a patterning process may be performed on the first mask structure by self-aligned double patterning (SADP), thereby forming a first pattern extending in a first direction. The SADP can achieve pattern multiplication to graphic with multiple processes.

Further, for the first pattern, in some embodiments, patterning the first mask structure to form a first pattern extending in a first direction includes the following operations.

The first photoresist layer is etched along the first direction to form a patterned first photoresist layer.

A first dielectric layer covering the first photoresist layer is formed on the mask structure layer, such that first trenches alternately arranged with the first photoresist layer are provided on the surface of the first dielectric layer.

The first dielectric layer located on a plane of the top of the first photoresist layer and below the first trenches is removed.

The first photoresist layer is removed to form a patterned first dielectric layer.

The pattern of the first dielectric layer is transferred to the mask structure layer by taking the first dielectric layer as a mask to form the first pattern extending in the first direction.

It is to be noted that, in the embodiment of the disclosure, the first mask structure 103 may be patterned with the SADP to form the first pattern extending in the first direction.

Figure 4A:
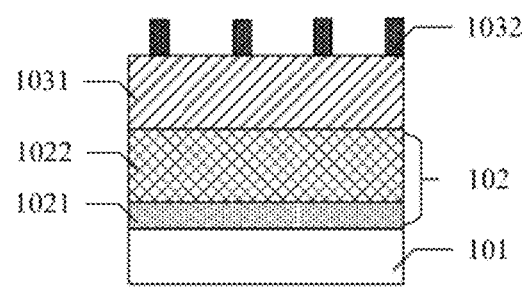
FIG. 4A is a schematic diagram of the structure obtained after a patterned first photoresist layer is formed according to an embodiment of the disclosure.
Figure 4B:
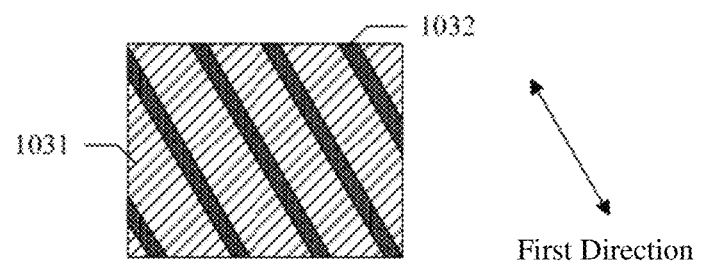
FIG. 4B is a top view of the structure obtained after a patterned first photoresist layer is formed according to an embodiment of the disclosure.
Figure 5A:
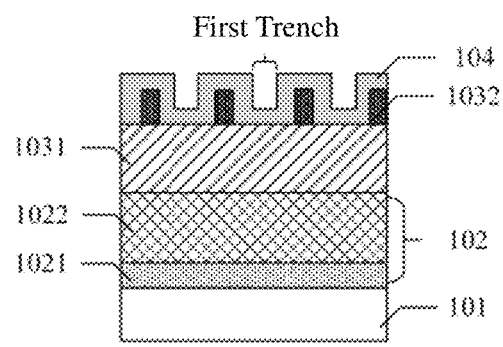
FIG. 5A is a schematic diagram of the structure obtained after a first dielectric layer is formed according to an embodiment of the disclosure.
Figure 5B:
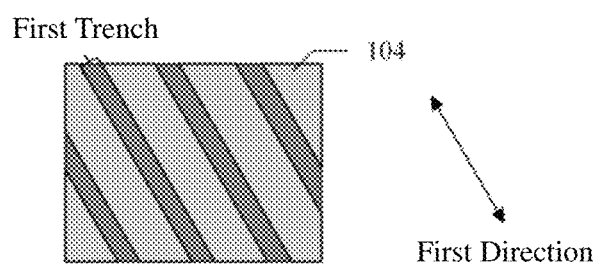
FIG. 5B is a top view of the structure obtained after a first dielectric layer is formed according to an embodiment of the disclosure.
Figure 6A:
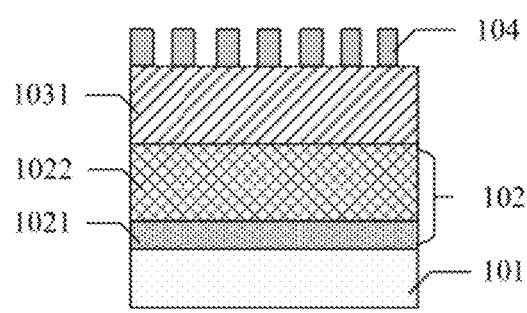
FIG. 6A is a schematic diagram of the structure obtained after a patterned first dielectric layer is formed according to an embodiment of the disclosure.
Figure 6B:
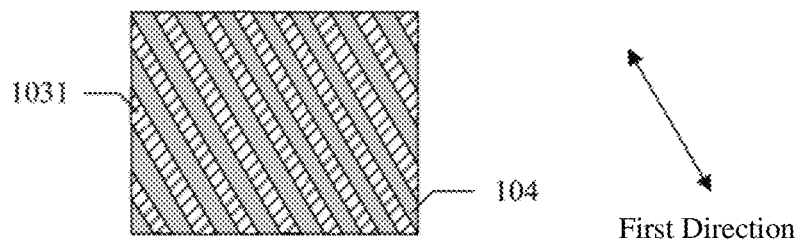
FIG. 6B is a top view of the structure obtained after a patterned first dielectric layer is formed according to an embodiment of the disclosure.
Figure 7A:
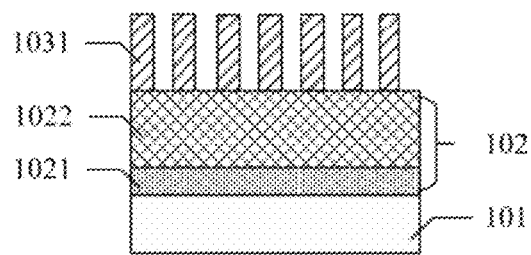
FIG. 7A is a schematic diagram of the structure obtained after a first pattern is formed according to an embodiment of the disclosure.
Figure 7B:
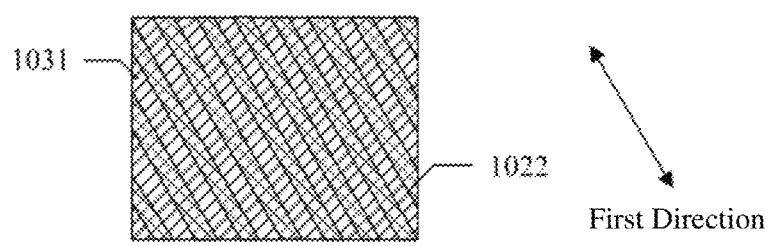
FIG. 7B is a top view of the structure obtained after a first pattern is formed according to an embodiment of the disclosure.

Referring to FIG. 4A, FIG. 4A is a schematic diagram of the structure obtained after the patterned first photoresist layer is formed according to the embodiment of the disclosure. Referring to FIG. 4B, FIG. 4B is a top view of the structure obtained after the patterned first photoresist layer is formed according to the embodiment of the disclosure. Referring to FIG. 5A, FIG. 5A is a schematic diagram of the structure after the first dielectric layer is formed according to the embodiment of the disclosure. Referring to FIG. 5B, FIG. 5B is a top view of the structure after the first dielectric layer is formed according to the embodiment of the disclosure. Referring to FIG. 6A, FIG. 6A is a schematic diagram of the structure after the patterned first dielectric layer is formed according to the embodiment of the disclosure. Referring to FIG. 6B, FIG. 6B is a top view of the structure after the patterned first dielectric layer is formed according to the embodiment of the disclosure. Referring to FIG. 7A, FIG. 7A is a schematic diagram of the structure after the first pattern is formed according to the embodiment of the disclosure. Referring to FIG. 7B, FIG. 7B is a top view of the structure after the first pattern is formed according to the embodiment of the disclosure.

It is to be noted that, when the first mask structure is patterned, as shown in FIGS. 4A and 4B, the first photoresist layer 1032 is etched along the first direction, thereby forming a patterned first photoresist layer 1032. Specifically, an initial first photoresist layer is formed on the mask structure layer 1031, and the initial first photoresist layer is patterned along the first direction to form the patterned first photoresist layer 1032.

As shown in FIGS. 5A and 5B, a first dielectric layer 104 covering the first photoresist layer 1032 is formed on the mask structure layer 1031. The first dielectric layer 104 covers the patterned first photoresist layer 1032, such that first trenches alternately arranged with the patterned first photoresist layer 1032 are provided on the surface of the first dielectric layer 104.

It is to be noted that, in FIG. 5B, the first trenches are shown in a deep color for ease of representation.

As shown in FIGS. 6A and 6B, part of the first dielectric layer 104 located on the first photoresist layer 1032 and part of the first dielectric layer 104 located below the first trenches is removed, and the first photoresist layer 1032 is removed, thereby obtaining a patterned first dielectric layer 104. The pattern of the patterned first dielectric layer 104 extends in the first direction.

As shown in FIGS. 7A and 7B, the pattern of the first dielectric layer 104 is transferred to the mask structure layer 1031 by taking the first dielectric layer 104 as a mask, thereby obtaining the first pattern extending in the first direction. The process of transferring the pattern may include etching the mask structure layer 1031 exposed from the first dielectric layer 104, and obtaining a patterned mask structure layer 1031, i.e., the first pattern, after removing the exposed mask structure layer 1031. Further, the method may further include removing the first dielectric layer 104.

For S104 and S105, after the first pattern is obtained, a second mask structure continues to be formed on the first pattern such that a patterning process can be performed on the second mask structure to form a second pattern.

In some embodiments, before a second mask structure is formed on the first pattern, the method may further include forming a first sacrificial layer on the MTJ structure, covering the mask structure layer.

It is to be noted that, before the second mask structure is formed, a first sacrificial layer covering the mask structure layer is formed first on the MTJ structure. The top surface of the first sacrificial layer may be flush with that of the first pattern, or slightly higher than that of the first pattern. The height of the first sacrificial layer is related to practical process parameters and process level. No specific limits are made thereto in the embodiment of the disclosure.

In some embodiments, the second mask structure includes a second photoresist layer and a second dielectric layer. The operation that the second mask structure is patterned to form the second pattern extending in the second direction may include the following operations.

The second photoresist layer is formed on the first sacrificial layer and the mask structure layer.

The second photoresist layer is etched in the second direction to form a patterned second photoresist layer.

A second dielectric layer covering the second photoresist layer is formed on the first sacrificial layer, such that second trenches alternately arranged with the second photoresist layer are provided on the surface of the second dielectric layer.

The second dielectric layer located on the plane of a top of the second photoresist layer and below the second trenches is removed.

The second photoresist layer is removed to form the second pattern extending in the second direction.

It is to be noted that, in the example, the second mask structure may specifically include a third photoresist layer and a second dielectric layer. It is to be noted that, in the embodiments of the disclosure, the second mask structure may be patterned by the SADP to form the second pattern extending in the second direction.

Figure 8:
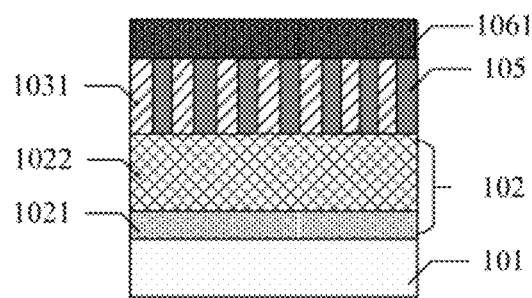
FIG. 8 is a schematic diagram of the structure obtained after a second photoresist layer is formed according to an embodiment of the disclosure.
Figure 9A:
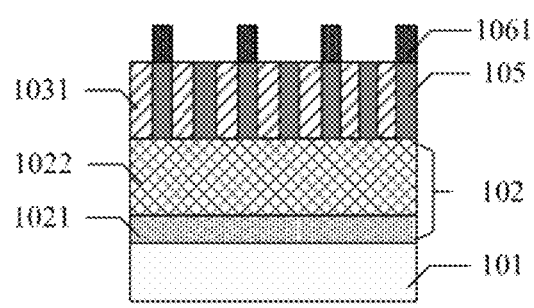
FIG. 9A is a schematic diagram of the structure obtained after a patterned second photoresist layer is formed according to an embodiment of the disclosure.
Figure 9B:
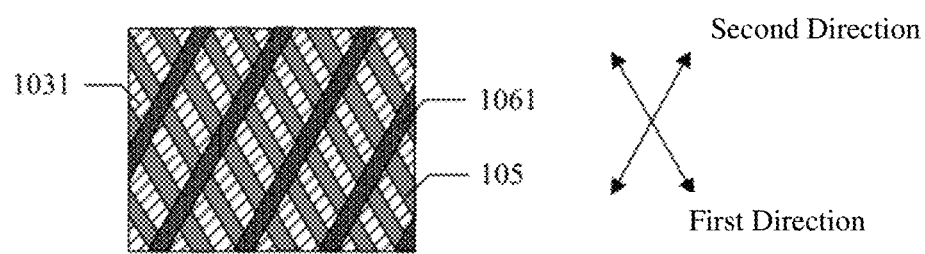
FIG. 9B is a top view of the structure obtained after a patterned second photoresist layer is formed according to an embodiment of the disclosure.
Figure 10A:
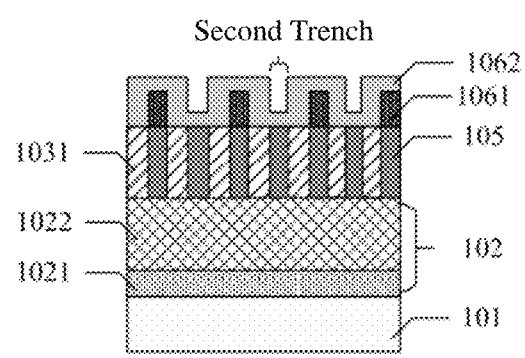
FIG. 10A is a schematic diagram of the structure obtained after a second dielectric layer is formed according to an embodiment of the disclosure.
Figure 10B:
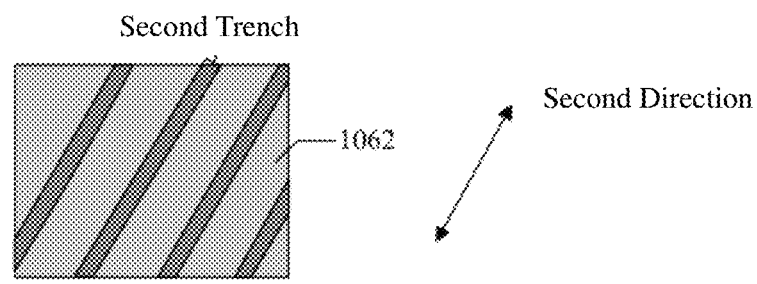
FIG. 10B is a top view of the structure obtained after a second dielectric layer is formed according to an embodiment of the disclosure.
Figure 11A:
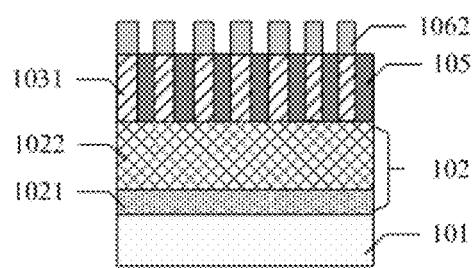
FIG. 11A is a schematic diagram of the structure obtained after a second pattern is formed according to an embodiment of the disclosure.
Figure 11B:
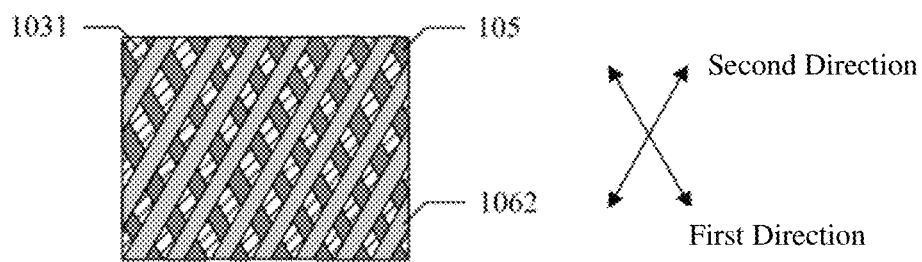
FIG. 11B is a top view of the structure obtained after a second pattern is formed according to an embodiment of the disclosure.

Specifically, referring to FIG. 8, FIG. 8 is a schematic diagram of the structure obtained after the second photoresist layer is formed according to the embodiment of the disclosure. Referring to FIG. 9A, FIG. 9A is a schematic diagram of the structure obtained after the patterned second photoresist layer is formed according to the embodiment of the disclosure. Referring to FIG. 9B, FIG. 9B is a top view of the structure obtained after the patterned second photoresist layer is formed according to the embodiment of the disclosure. Referring to FIG. 10A, FIG. 10A is a schematic diagram of the structure after the second dielectric layer is formed according to the embodiment of the disclosure. Referring to FIG. 10B, FIG. 10B is a top view of the structure after the second dielectric layer is formed according to the embodiment of the disclosure. Referring to FIG. 11A, FIG. 11A is a schematic diagram of the structure after the second pattern is formed according to the embodiment of the disclosure. Referring to FIG. 11B, FIG. 11B is a top view of the structure after the second pattern is formed according to the embodiment of the disclosure.

When patterning the second mask structure, as shown in FIG. 8, a first sacrificial layer 105 covering the mask structure layer 1031 is formed on the MTJ structure 102. A second photoresist layer 1061 is formed on the first sacrificial layer 105 (in the drawings of the embodiment of the disclosure, the top surface of the first sacrificial layer 105 is, for example, flush with that of the first pattern) and the mask structure layer 1031.

As shown in FIGS. 9A and 9B, the second photoresist layer 1061 is etched in the second direction to obtain the patterned second photoresist layer 1061. The first direction intersects the second direction. The first direction is not perpendicular to the second direction.

As shown in FIGS. 10A and 10B, a second dielectric layer 1062 covering the second photoresist layer 1061 is formed on the first sacrificial layer 105. In FIG. 10A, specifically, the second dielectric layer 1062 is formed on the first sacrificial layer 105 and the mask structure layer 1031, and covers the first sacrificial layer 105, such that second trenches alternately arranged with the second photoresist layer 1061 are provided on the surface of the second dielectric layer 1062.

It is to be noted that, in FIG. 10B, the second trenches are shown in a deep color for ease of representation.

As shown in FIGS. 11A and 11B, the part of the second dielectric layer 1062 located on the top surface of the second photoresist layer 1051 and the part of the second dielectric layer 1062 located below the second trenches is removed, and the second photoresist layer 1061 is removed, thereby obtaining a patterned second dielectric layer 1062, i.e., the second pattern. The second pattern extends in the second direction.

For S106, after the second pattern is obtained, the first pattern is patterned by utilizing the second pattern, thereby obtaining a cellular pattern.

Further, in some embodiments, patterning the first pattern by utilizing the second pattern to obtain the cellular pattern includes the following operation. The mask structure layer and the first sacrificial layer are patterned by taking the second pattern as a mask, the first sacrificial layer and part of the mask structure layer that is not covered by the second dielectric layer are removed, and the second dielectric layer is removed, to form the cellular pattern with the retained mask structure layer.

Figure 12A:
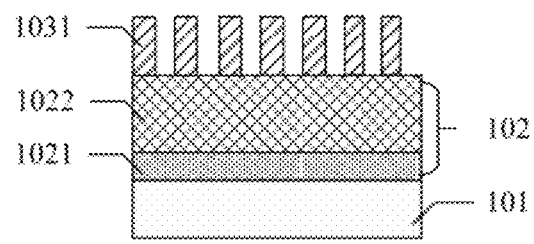
FIG. 12A is a schematic diagram of the structure obtained after a cellular pattern is formed according to an embodiment of the disclosure.
Figure 12B:
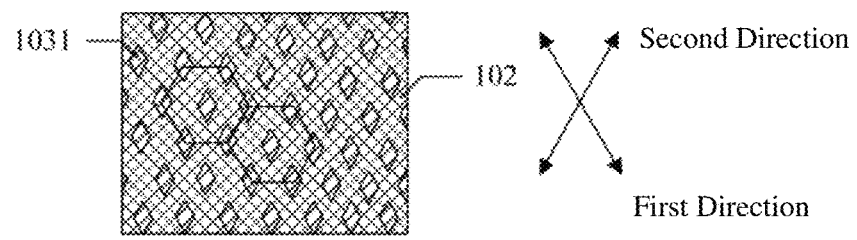
FIG. 12B is a top view of the structure obtained after a cellular pattern is formed according to an embodiment of the disclosure.

It is to be noted that references are made to FIGS. 12A and 12B. FIG. 12A is a schematic diagram of the structure obtained after the cellular pattern is formed according to the embodiment of the disclosure. Referring to FIG. 12B, FIG. 12B is a top view of the structure obtained after the cellular pattern is formed according to the embodiment of the disclosure.

As shown in FIGS. 12A and 12B, when transferring the second pattern to the first pattern to form the cellular pattern, both the mask structure layer 1031 and first sacrificial layer 105 below the second pattern are patterned by taking the second pattern as a mask, the first sacrificial layer 105 and part of the mask structure layer 1031 not covered by the second dielectric layer 1062 are removed, and the second dielectric layer 1062 is removed, so that the retained mask structure layer 1031 forms the cellular pattern. As shown in FIG. 12A, in the mask structure layer 1031 with the cellular pattern, for each unit, (each pillar in the mask structure layer 1031 is referred to as a unit) six units around it are connected with one another to present a cellular shape.

It is also to be noted that, when the first sacrificial layer 105 is removed, the mask structure layer 1031 may be partially etched such that the height thereof is reduced. That is, the height of the mask structure layer 1031 as shown in FIG. 12A is slightly smaller than that of the mask structure layer 1031 in FIG. 11A.

The process of the implementation mode of forming the cellular pattern in case that the first mask structure is a double-layer mask structure is described in detail above. For S102 to S106, in another implementation mode of the embodiments of the disclosure, the first mask structure may be a single-layer mask structure. That is, the first mask structure includes a third photoresist layer only. Then, the process of forming the cellular pattern in this implementation mode will be described in detail.

Figure 13:
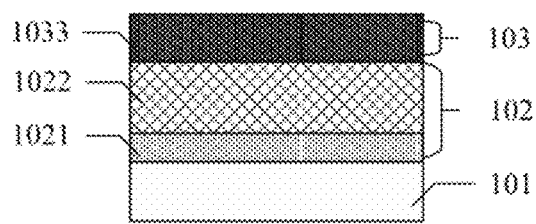
FIG. 13 is another schematic diagram of the structure obtained after a first mask structure is formed according to an embodiment of the disclosure.

For S102, operations for forming the MTJ structure on the substrate are the same as those in the above examples. Referring to FIG. 2, elaborations are omitted herein. After the MTJ structure 102 is formed, a first mask structure 103 continues to be formed on the MTJ structure 102. Referring to FIG. 13, FIG. 13 is another schematic diagram of the structure obtained after a first mask structure 103 is formed according to an embodiment of the disclosure.

As shown in FIG. 13, in this implementation mode, the first mask structure 103 includes a third photoresist layer 1033. The third photoresist layer 1033 is formed on the MTJ structure 102. Specifically, the third photoresist layer 1033 is formed on the MTJ mask layer 1022.

In a specific example, the structure shown in FIG. 13 may be understood with reference to the above specific descriptions about the structure shown in FIG. 3, and the difference is that the structure in FIG. 13 does not include a mask structure layer.

For S103, after the first mask structure 103 is formed, the first mask structure is patterned by SADP, thereby forming a first pattern extending in a first direction.

Further, for the first pattern, in some embodiments, patterning the first mask structure to form the first pattern extending in the first direction includes the following operations.

The third photoresist layer is etched along the first direction to form a patterned third photoresist layer.

A third dielectric layer covering the third photoresist layer is formed on the MTJ structure, such that third trenches alternately arranged with the third photoresist layer are provided on the surface of the third dielectric layer.

The third dielectric layer located on a plane of a top of the third photoresist layer and below the third trenches is removed.

The third photoresist layer is removed to form the first pattern extending in the first direction.

Figure 14A:
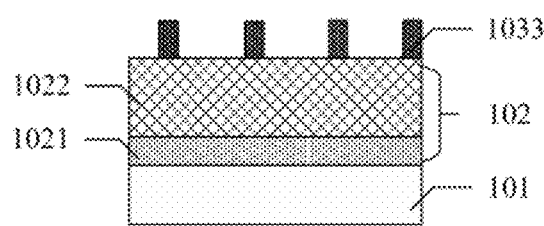
FIG. 14A is a schematic diagram of the structure obtained after a patterned third photoresist layer is formed according to an embodiment of the disclosure.
Figure 14B:
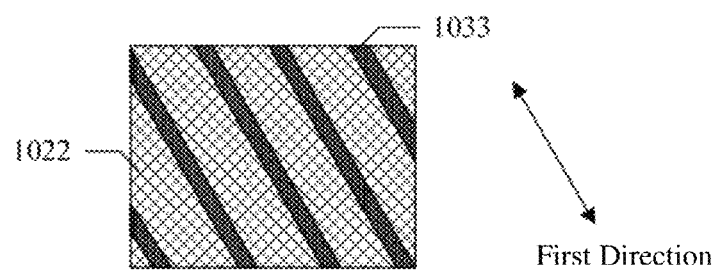
FIG. 14B is a top view of the structure obtained after a patterned third photoresist layer is formed according to an embodiment of the disclosure.
Figure 15A:
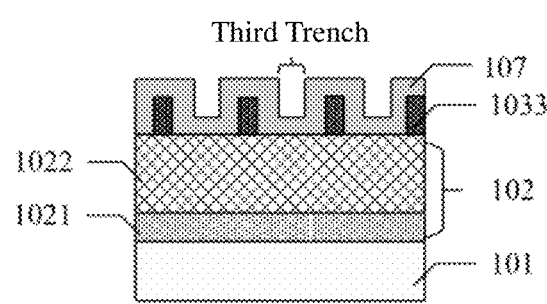
FIG. 15A is a schematic diagram of the structure obtained after a third dielectric layer is formed according to an embodiment of the disclosure.
Figure 15B:
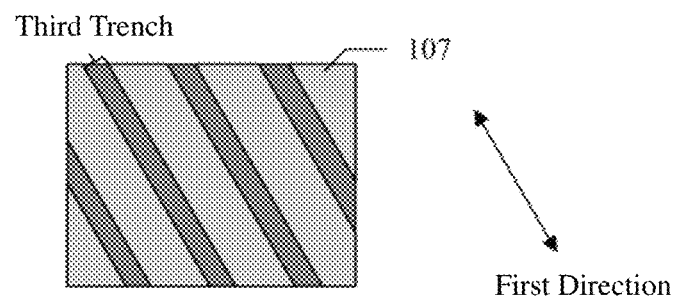
FIG. 15B is a top view of the structure obtained after a third dielectric layer is formed according to an embodiment of the disclosure.
Figure 16A:
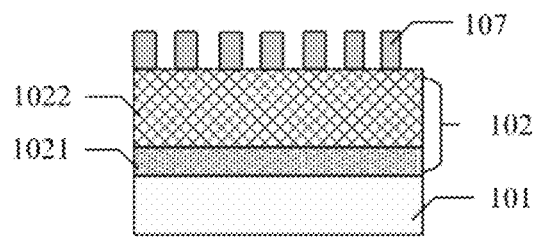
FIG. 16A is another schematic diagram of the structure obtained after a first pattern is formed according to an embodiment of the disclosure.
Figure 16B:
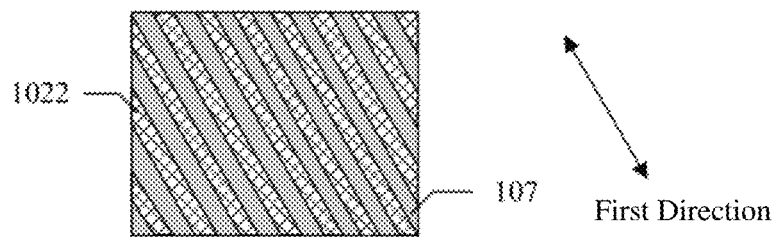
FIG. 16B is another top view of the structure obtained after a first pattern is formed according to an embodiment of the disclosure.

Referring to FIG. 14A, FIG. 14A is a schematic diagram of the structure obtained after the patterned third photoresist layer is formed according to the embodiment of the disclosure. Referring to FIG. 14B, FIG. 14B is a top view of the structure obtained after the patterned third photoresist layer is formed according to the embodiment of the disclosure. Referring to FIG. 15A, FIG. 15A is a schematic diagram of the structure after the third dielectric layer is formed according to the embodiment of the disclosure. Referring to FIG. 15B, FIG. 15B is a top view of the structure after the third dielectric layer is formed according to the embodiment of the disclosure. Referring to FIG. 16A, FIG. 16A is another schematic diagram of the structure after the first pattern is formed according to the embodiment of the disclosure. Referring to FIG. 16B, FIG. 16B is another top view of the structure after the first pattern is formed according to the embodiment of the disclosure.

It is to be noted that, when patterning the first mask structure, as shown in FIGS. 14A and 14B, the third photoresist layer 1033 is etched along the first direction, thereby forming a patterned third photoresist layer 1033.

As shown in FIGS. 15A and 15B, a third dielectric layer 107 covering the third photoresist layer 1033 is formed on the MTJ structure 102. The third dielectric layer 107 covers the patterned third photoresist layer 1033, such that third trenches alternately arranged with the patterned third photoresist layer 1033 are provided on the surface of the third photoresist layer 1033.

It is to be noted that, in FIG. 15B, the third trenches are shown in a deep color for ease of representation.

As shown in FIGS. 16A and 16B, the part of the third dielectric layer 107 located on the third photoresist layer 1033 and the part of the third dielectric layer 107 located below the third trenches are removed, and the third photoresist layer 1033 is removed, thereby obtaining the first pattern extending in the first direction (i.e., a patterned third dielectric layer 107).

For S104 and S105, after the first pattern is obtained, a second mask structure continues to be formed on the first pattern such that a patterning process can be performed on the second mask structure to form a second pattern.

In some embodiments, before a second mask structure is formed on the first pattern, the method may further include forming a second sacrificial layer on the MTJ structure, covering the third dielectric layer.

It is to be noted that, before the second mask structure is formed, the second sacrificial layer covering the third dielectric layer is formed first on the MTJ structure. The top surface of the second sacrificial layer may be flush with that of the first pattern, or slightly higher than that of the first pattern, which is related to practical process parameters and process level. No specific limits are made thereto in the embodiment of the disclosure.

In some embodiments, the second mask structure includes a fourth photoresist layer and a fourth dielectric layer. The operation that the second mask structure is patterned to form the second pattern extending in the second direction includes the following operations.

The fourth photoresist layer is formed on the second sacrificial layer and the fourth dielectric layer.

The fourth photoresist layer is etched in the second direction to form a patterned fourth photoresist layer.

The fourth dielectric layer covering the fourth photoresist layer is formed on the second sacrificial layer, such that fourth trenches alternately arranged with the fourth photoresist layer are provided on the surface of the fourth dielectric layer.

The fourth dielectric layer located on a plane of a top of the fourth photoresist layer and below the fourth trenches is removed.

The fourth photoresist layer is removed to form the second pattern extending in the second direction.

It is to be noted that, in the example, the second mask structure may specifically include a fourth photoresist layer and a fourth dielectric layer. It is to be noted that, in the embodiments of the disclosure, the patterning process may be performed on the second mask structure by the SADP to form the second pattern extending in the second direction.

Figure 17:
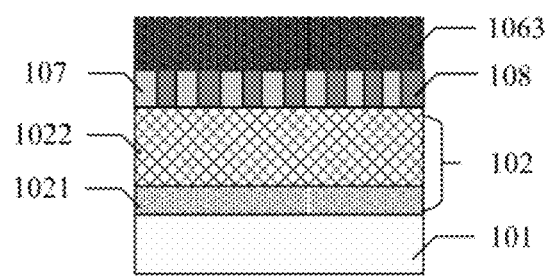
FIG. 17 is a schematic diagram of the structure obtained after a fourth photoresist layer is formed according to an embodiment of the disclosure.
Figure 18A:
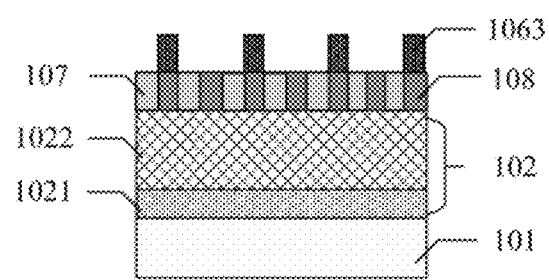
FIG. 18A is a schematic diagram of the structure obtained after a patterned fourth photoresist layer is formed according to an embodiment of the disclosure.
Figure 18B:
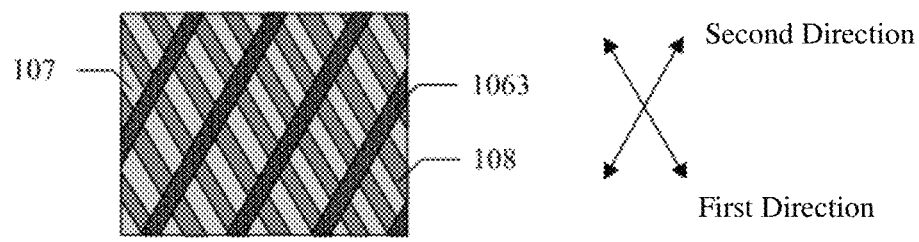
FIG. 18B is a top view of the structure obtained after a patterned fourth photoresist layer is formed according to an embodiment of the disclosure.
Figure 19A:
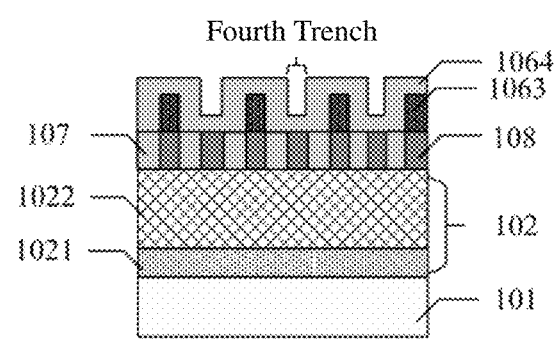
FIG. 19A is a schematic diagram of the structure obtained after a fourth dielectric layer is formed according to an embodiment of the disclosure.
Figure 19B:
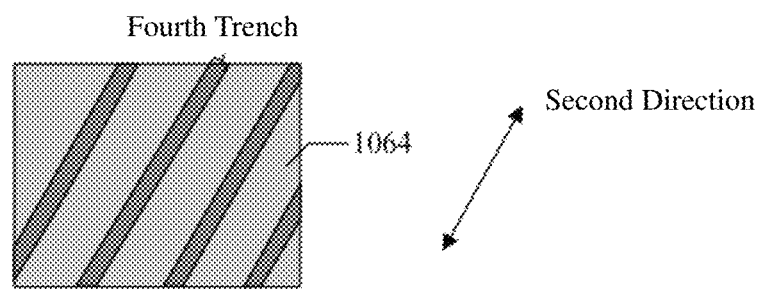
FIG. 19B is a top view of the structure obtained after a fourth dielectric layer is formed according to an embodiment of the disclosure.
Figure 20A:
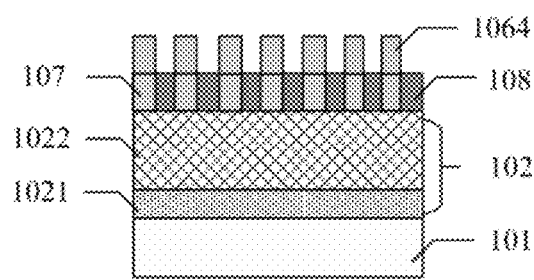
FIG. 20A is another schematic diagram of the structure obtained after a second pattern is formed according to an embodiment of the disclosure.
Figure 20B:
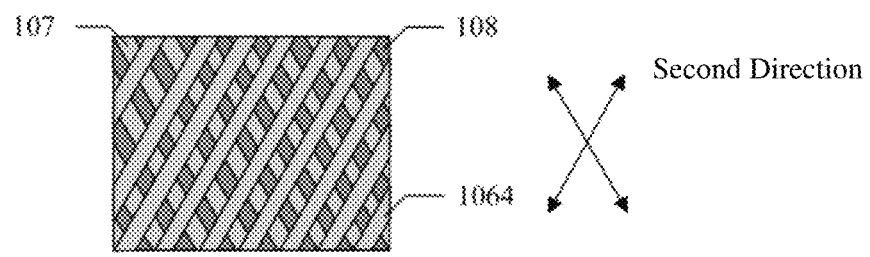
FIG. 20B is another top view of the structure obtained after a second pattern is formed according to an embodiment of the disclosure.

Specifically, referring to FIG. 17, FIG. 17 is a schematic diagram of the structure obtained after the fourth photoresist layer is formed according to the embodiment of the disclosure. Referring to FIG. 18A, FIG. 18A is a schematic diagram of the structure obtained after the patterned fourth photoresist layer is formed according to the embodiment of the disclosure. Referring to FIG. 18B, FIG. 18B is a top view of the structure obtained after the patterned fourth photoresist layer is formed according to the embodiment of the disclosure. Referring to FIG. 19A, FIG. 19A is a schematic diagram of the structure after the fourth dielectric layer is formed according to the embodiment of the disclosure. Referring to FIG. 19B, FIG. 19B is the top view of the structure after the fourth dielectric layer is formed according to an embodiment of the disclosure. Referring to FIG. 20A, FIG. 20A is another schematic diagram of the structure after the second pattern is formed according to the embodiment of the disclosure. Referring to FIG. 20B, FIG. 20B is another top view of the structure after the second pattern is formed according to the embodiment of the disclosure.

When patterning the second mask structure, as shown in FIG. 17, a fourth photoresist layer 1063 is formed on the second sacrificial layer 108 (in the drawings of the embodiment of the disclosure, the top surface of the second sacrificial layer 108 is, for example, flush with that of the first pattern) and the third dielectric layer 107.

As shown in FIGS. 18A and 18B, the fourth photoresist layer 1063 is etched in the second direction to obtain a patterned fourth photoresist layer 1063. The first direction intersects the second direction. The first direction is not perpendicular to the second direction.

As shown in FIGS. 19A and 19B, a fourth dielectric layer 1064 covering the fourth photoresist layer 1063 is formed on the second sacrificial layer 108. In FIG. 19A, specifically, the fourth dielectric layer 1064 is formed on the second sacrificial layer 108 and the third dielectric layer 107, and covers the fourth photoresist layer 1063, such that fourth trenches alternately arranged with the fourth photoresist layer 1063 are provided on the surface of the fourth dielectric layer 1064.

It is to be noted that, in FIG. 19B, the fourth trenches are shown in a deep color for ease of representation.

As shown in FIGS. 20A and 20B, the part of the fourth dielectric layer 1064 located on the top surface of the fourth photoresist layer 1063 and the part of the fourth dielectric layer 1064 located below the fourth trench is removed, and the fourth photoresist layer 1063 is removed, thereby obtaining a patterned fourth dielectric layer 1064, i.e., the second pattern. The second pattern extends in the second direction.

For S106, after the second pattern is obtained, the first pattern is patterned by utilizing the second pattern, thereby obtaining a cellular pattern.

Further, in some embodiments, the first pattern is patterned by utilizing the second pattern to obtain a cellular pattern includes the following operation. The third dielectric layer and the second sacrificial layer are patterned by taking the second pattern as a mask, the second sacrificial layer and part of the third dielectric layer that is not covered by the fourth dielectric layer are removed, and the fourth dielectric layer is removed, so as to form the cellular pattern with the retained third dielectric layer.

Figure 21A:
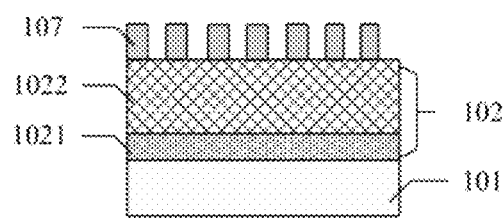
FIG. 21A is another schematic diagram of the structure obtained after a cellular pattern is formed according to an embodiment of the disclosure.
Figure 21B:
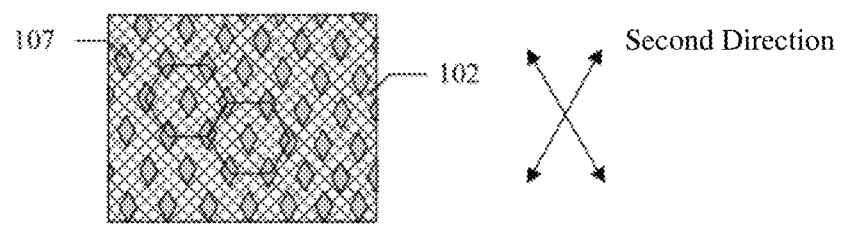
FIG. 21B is another top view of the structure obtained after a cellular pattern is formed according to an embodiment of the disclosure.

It is to be noted that references are made to FIGS. 21A and 21B. FIG. 21A is another schematic diagram of the structure obtained after the cellular pattern is formed according to the embodiment of the disclosure. Referring to FIG. 21B, FIG. 21B is another top view of the structure obtained after the cellular pattern is formed according to the embodiment of the disclosure.

As shown in FIGS. 21A and 21B, when transferring the second pattern to the first pattern to form the cellular pattern, both the third dielectric layer 107 and the second sacrificial layer 108 below the second pattern are patterned by taking the second pattern as a mask, the second sacrificial layer 108 and part of the third dielectric layer 107 that is not covered by the fourth dielectric layer 1064 are removed, and the fourth dielectric layer 1064 is removed, such that the retained third dielectric layer 107 forms the cellular pattern. As shown in FIG. 21A, in the third dielectric layer 107 with the cellular pattern, for each unit (each pillar in the third dielectric layer 107 is referred to as a unit), six units around it are connected with one another to present a cellular shape.

The process of the implementation mode for forming the cellular pattern in case that the first mask structure is a single-layer mask structure is described in detail above.

In S107, the cellular pattern is transferred to the MTJ structure to form a cellular MTJ array.

It is to be noted that, after the mask structure layer 1031 forms the cellular pattern, the cellular pattern is further transferred to the MTJ structure to finally obtain a cellular MTJ array.

In some embodiments, transferring the cellular pattern to the MTJ structure to form a cellular MTJ array includes the following operations.

The cellular pattern is transferred to the MTJ mask layer by taking the first mask structure as a mask to form a patterned MTJ mask layer.

The cellular pattern is transferred to the MTJ layer by taking the MTJ mask layer as a mask to form the cellular MTJ array.

It is to be noted that, after the cellular pattern is obtained, the cellular pattern is transferred to the MTJ mask layer by taking the first mask structure with the cellular pattern as a mask, thereby obtaining the patterned MTJ mask layer, and then the MTJ structure with the cellular pattern is further taken as a mask to finally obtain the cellular MTJ array.

It is also to be noted that, for the operation that the cellular pattern is transferred to the MTJ mask layer to form a patterned MTJ mask layer, and the implementation modes herein are a little different from the implementation modes of the double-layer and single-layer structures of the first mask structure.

Figure 22A:
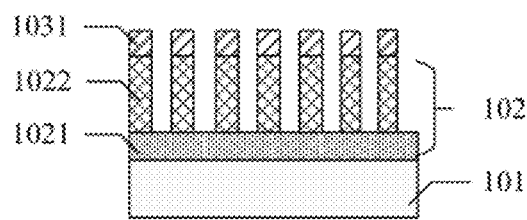
FIG. 22A is a schematic diagram of the structure obtained after a cellular pattern is formed according to an embodiment of the disclosure.
Figure 22B:
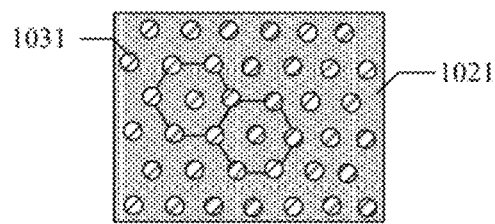
FIG. 22B is a top view of the structure obtained after a cellular pattern is formed according to an embodiment of the disclosure.

Specifically, in a first implementation mode, for the cellular pattern formed in the mask structure layer 1031, referring to FIG. 22A, FIG. 22A is a schematic diagram of the structure obtained after the cellular pattern is formed according to an embodiment of the disclosure. Referring to FIG. 22B, FIG. 22B is a top view of the structure obtained after the cellular pattern is formed according to the embodiment of the disclosure.

The cellular pattern is transferred to the MTJ mask layer 1022 by taking the first mask layer 103 as a mask, namely taking the mask layer structure 1031 as a mask. Specifically, an etching process may be performed on the MTJ mask layer 1022 exposed from the mask structure layer 1031, thus the cellular pattern is transferred. In this process, part of the mask structure layer 1031 may also be etched. Therefore, the height of the mask structure layer 1031 in FIG. 22A is smaller than that in FIG. 12A.

It is to be noted that the pattern may be adjusted in a practical patterning process, so that each unit in the formed cellular pattern is usually cylindrical. That is, each unit from the top view in FIG. 22B is round.

Figure 23A:
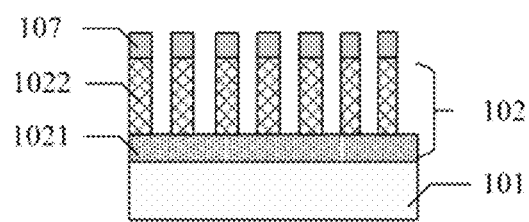
FIG. 23A is another schematic diagram of the structure obtained after a cellular pattern is formed according to an embodiment of the disclosure.
Figure 23B:
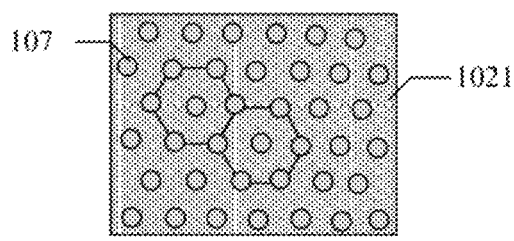
FIG. 23B is another top view of the structure obtained after a cellular pattern is formed according to an embodiment of the disclosure.

In the second implementation mode, for the cellular pattern formed in the third dielectric layer 107, references are made to FIG. 23A, which is another schematic diagram of the structure obtained after the cellular pattern is formed according to an embodiment of the disclosure, and to FIG. 23B, which is another top view of the structure obtained after a cellular pattern is formed according to an embodiment of the disclosure.

The cellular pattern is transferred to the MTJ mask layer 1022 by taking the first mask layer 103 as a mask, namely taking the third dielectric layer 107 as a mask. Specifically, an etching process may be performed on the MTJ mask layer 1022 exposed from the third dielectric layer 107, thus the cellular pattern is transferred. In this process, part of the third dielectric layer 107 may also be etched. Therefore, the height of the third dielectric layer 107 in FIG. 23A is smaller than that of the third dielectric layer 107 in FIG. 21A.

It is to be noted that the pattern may be adjusted in a practical patterning process, so that each unit in the formed cellular pattern is usually cylindrical. That is, each unit from the top view in FIG. 23B is round.

After the patterned MTJ mask layer 1022 is formed, the cellular pattern is transferred to the MTJ layer 1021 by taking the MTJ mask layer 1022 as a mask to form the cellular MTJ array.

In some embodiments, the method may further include removing the first mask structure, and removing part of the MTJ mask layer in a vertical direction.

Figure 24A:
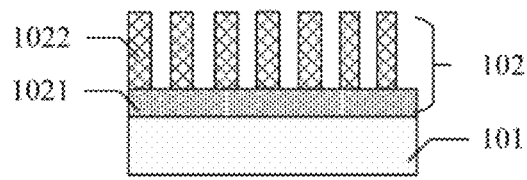
FIG. 24A is a schematic diagram of the structure obtained after a first mask structure is removed according to an embodiment of the disclosure.
Figure 24B:
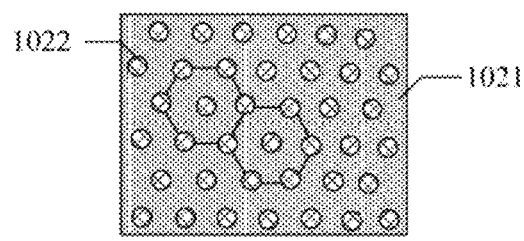
FIG. 24B is a top view of the structure obtained after a first mask structure is removed according to an embodiment of the disclosure.

It is to be noted that, for the cellular pattern formed in the mask layer structure, the first mask structure is removed, namely the mask layer structure is removed. For the cellular pattern formed in the third dielectric layer, the first mask structure is removed, namely the third dielectric layer is removed. Specifically, references are made to FIGS. 24A and 24B. FIG. 24A is a schematic diagram of the structure obtained after the first mask structure is removed according to an embodiment of the disclosure. FIG. 24B is a top view of the structure obtained after the first mask structure is removed according to the embodiment of the disclosure.

Figure 25A:
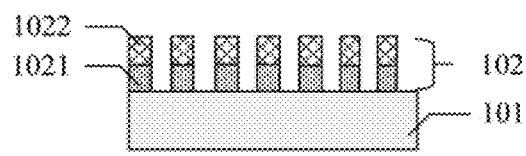
FIG. 25A is a schematic diagram of a cellular MTJ array according to an embodiment of the disclosure.
Figure 25B:
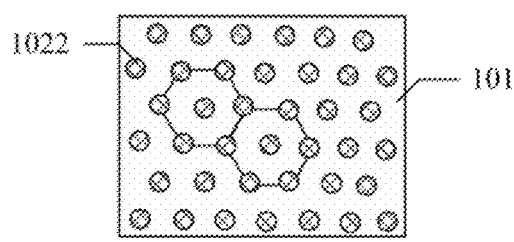
FIG. 25B is a top view of a cellular MTJ array according to an embodiment of the disclosure.

Further, references are made to FIGS. 25A and 25B. FIG. 25A is a schematic diagram of the structure of a cellular MTJ array according to an embodiment of the disclosure. FIG. 25B is a top view of a cellular MTJ array according to an embodiment of the disclosure.

As shown in FIGS. 25A and 25B, when transferring the cellular pattern to the MTJ layer 1021 to form the cellular MTJ array, since both the MTJ layer 1021 and the MTJ mask layer 1022 are usually metal materials, the MTJ mask layer 1022 may also be partially removed during transferring the pattern. Therefore, as described above, in the MTJ structure before transferring the cellular pattern thereto to form the cellular MTJ array, the height ratio of the MTJ mask layer 1022 to the MTJ layer 1021 ranges from 1.5:1 to 3:1. As such, the MTJ mask layer 1022 is prevented from being consumed excessively during transferring the pattern. Therefore, a proper height ratio of the MTJ mask layer 1022 to the MTJ layer 1021 in the finally obtained MTJ array is achieved.

In some embodiments, in the cellular MTJ array after transferring the cellular pattern to the MTJ structure to form the cellular MTJ array, the height ratio of the MTJ mask layer to the MTJ layer ranges from 0.5:1 to 1.5:1.

That is, the MTJ array obtained in the embodiment of the disclosure has the cellular pattern, and includes two layers of structures, i.e., the MTJ layer and the MTJ mask layer. The MTJ mask layer serves as a top electrode of the semiconductor structure.

Further, after the cellular MTJ array is formed, the method may further include the following operation.

An insulating layer covering the cellular MTJ array is formed on the substrate.

Figure 26:
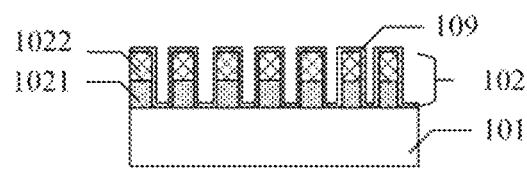
FIG. 26 is a schematic diagram of a semiconductor structure according to an embodiment of the disclosure.

It is to be noted that, referring to FIG. 26, FIG. 26 is a schematic diagram of the structure of a semiconductor structure according to an embodiment of the disclosure. As shown in FIG. 26, after the MTJ array is formed, an insulating layer 109 covering the MTJ array is further formed on the substrate in the embodiment of the disclosure. For example, the insulating layer is formed by a process such as deposition. The material of the insulating layer 109 includes SiNx, SiOx, etc.

Further, in some embodiments, an included angle between the first direction and the second direction is 60 degrees, and the cellular pattern is a hexagonal pattern. It is to be noted that, the included angle between the first direction and the second direction is preferably 60°, and the cellular pattern is a hexagonal pattern. Therefore, the density of the MTJ array can be improved maximally.

It is to be noted that, in the embodiments of the disclosure, the material of each of the first dielectric layer, the second dielectric layer, the third dielectric layer and the fourth dielectric layer may include silicon oxide (SiO or $SiO_2$), or the like. The material of each of the first sacrificial layer and the second sacrificial layer may include SOC. During the formation of each layer of the structure, a corresponding suitable method such as deposition, e.g., chemical vapor deposition (CVD) and physical vapor deposition (PVD), may be used according to a characteristic of a specifically selected material. During the removal of each layer of the structure, a suitable etching process, such as photo-etching, dry etching and wet etching, may be selected according to the characteristic of a material needed to be etched.

The MTJ array with the cellular pattern in the embodiments of the disclosure is an MTJ array with a hexagonal pattern. The hexagonal array is obtained by the method for manufacturing a semiconductor structure in the embodiments of the disclosure. The array represents a hexagonally honeycomb structure. Compared with an orthogonal array (the array represents a square structure), under the same unit spacing, the hexagonally cellular array allows much smaller size of a memory cell and higher memory density, so that, with the same storage area, the semiconductor structure obtained in the embodiments of the disclosure may store more data. In addition, with the same memory density, the higher symmetry and larger spacing of the hexagonal array are more conducive to the etching of the MTJ array, so that existing challenges in patterning of the MTJ array are solved.

In summary, the method for manufacturing a semiconductor structure in the embodiment of the disclosure may be implemented at least by the following two implementation modes.

The first mode includes the following operations. In S1, an MTJ layer and three mask layers (the three mask layers are an MTJ mask layer, a mask structure layer, and a first photoresist layer respectively) are deposited on a substrate. In S2, a first pattern is formed on the mask structure layer by SADP process. In S3, a second pattern is formed on the first pattern by SADP process. In S4, the second pattern is transferred to the first pattern, and the first pattern intersects the second pattern in the mask structure layer to form a cellular pattern. In S5, the cellular pattern is transferred to the MTJ mask layer. In S6, the MTJ layer is etched to form a cellular MTJ array.

The second mode includes the following operations. In S1, an MTJ layer and two mask layers (the two mask layers are an MTJ mask layer and a third photoresist layer respectively) are deposited on a substrate. In S2, a first pattern is formed on the mask structure layer by SADP process. In S3, a second pattern is formed on the first pattern by SADP process. In S4, the second pattern is transferred to the first pattern, and the first pattern intersects the second pattern in the mask structure layer to form a cellular pattern. In S5, the cellular pattern is transferred to the MTJ mask layer. In S6, the MTJ layer is etched to form a cellular MTJ array.

A cellular MTJ array in a semiconductor structure prepared by the method for manufacturing a semiconductor structure in the embodiments of the disclosure is high in density, and the shadow effect is improved greatly. In addition, the solution can be applied with the patterning process applied for DRAM, namely it is compatible with DRAM platform, and a small-spacing cellular pattern can be obtained by the method. Particularly for the first implementing mode, the mask structure layer benefits to transfer the pattern, and meanwhile, avoids cross contaminations between MTJ elements. That is, the embodiments of the disclosure particularly relate to the manufacturing of an MRAM chip, particularly high-density MTJ patterning, in which a hexagonally cellular high-density MTJ array is patterned by utilizing SADP technology and two/three mask layers. The embodiments of the disclosure may be applied to a high-density MRAM chip with small MTJ memory cells.

The embodiments of the disclosure provide a method for manufacturing a semiconductor structure. A cellular MTJ array is formed by providing a substrate with an MTJ structure and a first mask structure formed sequentially thereon; patterning the first mask structure to form a first pattern extending in a first direction; forming a second mask structure on the first pattern; patterning the second mask structure to form a second pattern extending in a second direction, in which the first direction intersects the second direction, and is not perpendicular to the second direction; patterning the first pattern by utilizing the second pattern to form a cellular pattern; and transferring the cellular pattern to the MTJ structure, so that the cellular MTJ array is formed. As such, the cellular MTJ array has a high density, so that the memory density of a semiconductor memory is improved when the memory is formed, and it is advantageous to extend the application market of MRAMs. Moreover, it is favorable to the patterning process when the MTJ layer is etched due to the high symmetry of the cellular pattern.

In another embodiment of the disclosure, referring to FIG. 26, FIG. 26 is a schematic diagram of the structure of a semiconductor structure according to an embodiment of the disclosure. As shown in FIG. 26, the semiconductor structure includes: a substrate 101; and a cellular MTJ array formed on the substrate 101.

The cellular MTJ array is arranged in a cellular pattern. The cellular pattern includes a first pattern extending in a first direction and a second pattern extending in a second direction, in which the first direction intersects the second direction, and the first direction is not perpendicular to the second direction.

In some embodiments, the semiconductor structure further includes an insulating layer 109. The insulating layer 109 is formed on the substrate 101, and covers the cellular MTJ array.

Further, for the cellular MTJ array, in some embodiments, the cellular MTJ array includes an MTJ layer 1021 and an MTJ mask layer 1022. The MTJ layer 1021 is provided on the substrate 101. The MTJ mask layer 1022 is provided on the MTJ layer 1021.

Further, for the cellular MTJ array, in some embodiments, a height ratio of the MTJ mask layer 1022 to the MTJ layer 1021 in the cellular MTJ array may range from 0.5:1 to 1.5:1.

Further, for the MTJ mask layer, in some embodiments, a material of the MTJ mask layer includes one or more of tantalum, tantalum nitride, titanium nitride and titanium.

Further, for the cellular pattern, in some embodiments, an included angle between the first direction and the second direction may be 60 degrees, and the cellular pattern may be a hexagonal pattern.

The embodiment of the disclosure provides a semiconductor structure, including a cellular MTJ array. The cellular MTJ array is high in density, so that the memory density of the semiconductor memory is improved when the semiconductor memory is formed, and this particularly contributes to extending the application market of an MRAM.

Figure 27:
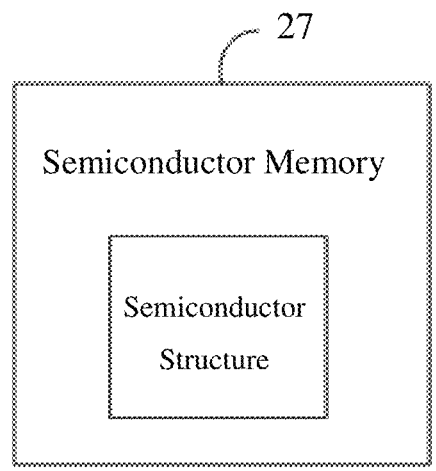
FIG. 27 is a schematic diagram of a semiconductor memory according to an embodiment of the disclosure.

In another embodiment of the disclosure, referring to FIG. 27, FIG. 27 is a schematic diagram of the structure of a semiconductor memory 27 according to an embodiment of the disclosure. As shown in FIG. 27, the semiconductor memory 27 includes the semiconductor structure as described in any one of the above-mentioned embodiments.

Further, the semiconductor memory includes an MRAM.

The semiconductor memory includes the semiconductor structure as described in the above-mentioned embodiments, so that a memory density thereof is improved greatly, and the application market thereof can be extended.

The above is only the preferred embodiments of the disclosure and not intended to limit the scope of protection of the disclosure.

It is to be noted that, in the disclosure, terms "include" and "contain" or any other variation thereof is intended to cover nonexclusive inclusions, so that a process, method, object, or device including a series of elements not only includes those elements, but also includes other elements that are not listed clearly, or further includes elements intrinsic to the process, the method, the object, or the device. With no more restrictions, an element defined by statement "including a/an" does not exclude the existence of the same other elements in a process, method, object, or device including the element.

The sequence numbers of the embodiments of the disclosure are only for description and do not represent superiority-inferiority of the embodiments.

The methods disclosed in some method embodiments provided in the disclosure may be combined freely without conflicts to obtain new method embodiments.

The characteristics disclosed in some product embodiments provided in the disclosure may be combined freely without conflicts to obtain new product embodiments.

The characteristics disclosed in some method or device embodiments provided in the disclosure may be combined freely without conflicts to obtain new method embodiments or device embodiments.

The above is only the specific implementation mode of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

INDUSTRIAL APPLICABILITY

A method for manufacturing a semiconductor structure, a semiconductor structure and a semiconductor memory are provided in the embodiments of the disclosure. A cellular MTJ array is formed by providing a substrate with an MTJ structure and a first mask structure formed sequentially thereon; patterning the first mask structure to form a first pattern extending in a first direction; forming a second mask structure on the first pattern; patterning the second mask structure to form a second pattern extending in a second direction, in which the first direction intersects the second direction, and is not perpendicular to the second direction; patterning the first pattern by utilizing the second pattern to form a cellular pattern; and transferring the cellular pattern the MTJ structure, so that the cellular MTJ array is formed. As such, the cellular MTJ array has a high density, so that the memory density of a semiconductor memory is improved when the memory is formed, and it is advantageous to extend the application market of MRAMs. Moreover, it is favorable to the patterning process when the MTJ layer is etched due to the high symmetry of the cellular pattern.

The invention claimed is:

1. A method for manufacturing a semiconductor structure, comprising:
    providing a substrate;
    forming a magnetic tunnel junction (MTJ) structure and a first mask structure sequentially on the substrate;
    patterning the first mask structure to form a first pattern extending in a first direction;
    forming a second mask structure on the first pattern;
    patterning the second mask structure to form a second pattern extending in a second direction, the first direction intersecting the second direction, and the first direction being not perpendicular to the second direction;
    patterning the first pattern by utilizing the second pattern to form a cellular pattern; and
    transferring the cellular pattern to the MTJ structure to form a cellular MTJ array.

2. The method of claim 1, wherein the first mask structure comprises a mask structure layer and a first photoresist layer; the mask structure layer is formed on the MTJ structure, and the first photoresist layer is formed on the mask structure layer; and
    correspondingly, patterning the first mask structure to form the first pattern extending in the first direction comprises:
    etching the first photoresist layer along the first direction to form a patterned first photoresist layer;
    forming, on the mask structure layer, a first dielectric layer covering the first photoresist layer, wherein first trenches alternately arranged with the patterned first photoresist layer are provided on a surface of the first dielectric layer;
    removing the first dielectric layer located on a plane of a top of the first photoresist layer and below the first trenches;
    removing the first photoresist layer to form a patterned first dielectric layer; and
    transferring a pattern of the first dielectric layer to the mask structure layer by taking the first dielectric layer as a mask to form the first pattern extending in the first direction.

3. The method of claim 2, further comprising:
    forming, on the MTJ structure, a first sacrificial layer covering the mask structure layer before forming the second mask structure on the first pattern.

4. The method of claim 3, wherein the second mask structure comprises a second photoresist layer and a second dielectric layer; and
    wherein patterning the second mask structure to form the second pattern extending in the second direction comprises:
    forming the second photoresist layer on the first sacrificial layer and the mask structure layer;
    etching the second photoresist layer along the second direction to form a patterned second photoresist layer;
    forming, on the first sacrificial layer, the second dielectric layer covering the second photoresist layer, wherein second trenches alternately arranged with the second photoresist layer are provided on a surface of the second dielectric layer;

removing the second dielectric layer located on a plane of a top of the second photoresist layer and below the second trenches; and removing the second photoresist layer to form the second pattern extending in the second direction.

5. The method of claim 4, wherein patterning the first pattern by utilizing the second pattern to form the cellular pattern comprises:

patterning the mask structure layer and the first sacrificial layer by taking the second pattern as a mask, removing the first sacrificial layer and the mask structure layer not covered by the second dielectric layer, and removing the second dielectric layer to form the cellular pattern with the retained mask structure layer.

6. The method of claim 1, wherein the first mask structure comprises a third photoresist layer, and the third photoresist layer is formed on the MTJ structure; and correspondingly, patterning the first mask structure to form the first pattern extending in the first direction comprises:

etching the third photoresist layer along the first direction to form a patterned third photoresist layer;

forming, on the MTJ structure, a third dielectric layer covering the third photoresist layer, wherein third trenches alternately arranged with the third photoresist layer are provided on a surface of the third dielectric layer;

removing the third dielectric layer located on a plane of a top of the third photoresist layer and below the third trenches; and removing the third photoresist layer to form the first pattern extending in the first direction.

7. The method of claim 6, further comprising:

forming, on the MTJ structure, a second sacrificial layer covering the third dielectric layer before forming the second mask structure on the first pattern.

8. The method of claim 7, wherein the second mask structure comprises a fourth photoresist layer and a fourth dielectric layer; and wherein patterning the second mask structure to form the second pattern extending in the second direction comprises:

forming the fourth photoresist layer on the second sacrificial layer and the third dielectric layer;

etching the fourth photoresist layer in the second direction to form a patterned fourth photoresist layer;

forming, on the second sacrificial layer, a fourth dielectric layer covering the fourth photoresist layer, wherein fourth trenches alternately arranged with the fourth photoresist layer are provided on a surface of the fourth dielectric layer;

removing the fourth dielectric layer located on a plane of a top of the fourth photoresist layer and below the fourth trenches; and removing the fourth photoresist layer to form the second pattern extending in the second direction.

9. The method of claim 8, wherein patterning the first pattern by utilizing the second pattern to form the cellular pattern comprises:

patterning the third dielectric layer and the second sacrificial layer by taking the second pattern as a mask, removing the second sacrificial layer and the third dielectric layer not covered by the fourth dielectric layer, and removing the fourth dielectric layer to form the cellular pattern with the retained third dielectric layer.

10. The method of claim 1, wherein the MTJ structure comprises an MTJ layer and an MTJ mask layer, wherein the MTJ layer is formed on the substrate, and the MTJ mask layer is formed on the MTJ layer.

11. The method of claim 10, wherein transferring the cellular pattern to the MTJ structure to form the cellular MTJ array comprises:

transferring the cellular pattern to the MTJ mask layer by taking the first mask structure as a mask to form a patterned MTJ mask layer; and transferring the cellular pattern to the MTJ layer by taking the MTJ mask layer as a mask to form the cellular MTJ array.

12. The method of claim 11, further comprising:

removing the first mask structure, and removing part of the MTJ mask layer in a vertical direction.

13. The method of claim 11, wherein, in the MTJ structure before transferring the cellular pattern to the MTJ structure to form the cellular MTJ array, a height ratio of the MTJ mask layer to the MTJ layer ranges from 1.5:1 to 3:1; and in the cellular MTJ array after transferring the cellular pattern to the MTJ structure to form the cellular MTJ array, a height ratio of the MTJ mask layer to the MTJ layer ranges from 0.5:1 to 1.5:1.

14. The method of claim 1, further comprising:

forming, on the substrate, an insulating layer covering the cellular MTJ array after forming the cellular MTJ array.

15. The method of claim 1, wherein an included angle between the first direction and the second direction is 60 degrees, and the cellular pattern is a hexagonal pattern.

* * * * *